(12) United States Patent
Schmidt

(10) Patent No.: US 9,329,242 B2
(45) Date of Patent: May 3, 2016

(54) METHOD AND APPARATUS FOR MONITORING THE SHORT-CIRCUITING SWITCHING DEVICE OF A THREE-PHASE MOTOR

(71) Applicant: FTS Computertechnik GmbH, Vienna (AT)

(72) Inventor: Eric Schmidt, Großkrut (AT)

(73) Assignee: FTS Computertechnik GmbH, Vienna (AT)

( * ) Notice: Subject to any disclaimer, the term of this patent is extended or adjusted under 35 U.S.C. 154(b) by 111 days.

(21) Appl. No.: 14/374,850

(22) PCT Filed: Jan. 30, 2013

(86) PCT No.: PCT/AT2013/050027
§ 371 (c)(1),
(2) Date: Jul. 25, 2014

(87) PCT Pub. No.: WO2013/113051
PCT Pub. Date: Aug. 8, 2013

(65) Prior Publication Data
US 2015/0002187 A1    Jan. 1, 2015

(30) Foreign Application Priority Data
Feb. 3, 2012 (AT) .............................. A 50023/2012

(51) Int. Cl.
| | | |
|---|---|---|
| *G01R 31/40* | (2014.01) | |
| *H02P 29/02* | (2016.01) | |
| *H02P 3/22* | (2006.01) | |
| *B60L 3/00* | (2006.01) | |
| *G01R 31/327* | (2006.01) | |
| *G01R 31/34* | (2006.01) | |

(52) U.S. Cl.
CPC ............. *G01R 31/40* (2013.01); *B60L 3/0076* (2013.01); *H02P 3/22* (2013.01); *H02P 29/021* (2013.01); *G01R 31/3277* (2013.01); *G01R 31/343* (2013.01); *Y02T 10/642* (2013.01)

(58) Field of Classification Search
CPC .. G01R 31/40; G01R 31/343; G01R 31/3277; H02P 3/22; H02P 29/021; B60L 3/76
See application file for complete search history.

(56) References Cited

U.S. PATENT DOCUMENTS

| | | | | |
|---|---|---|---|---|
| 5,617,281 A | * | 4/1997 | Bauer .................... | H01C 1/026 338/22 R |
| 2003/0193308 A1 | | 10/2003 | Richardson et al. | |
| 2009/0009920 A1 | * | 1/2009 | Yamada ................ | B60L 3/0023 361/93.1 |

FOREIGN PATENT DOCUMENTS

| | | |
|---|---|---|
| EP | 981056 A2 | 2/2000 |
| EP | 1487096 A1 | 12/2004 |

(Continued)

OTHER PUBLICATIONS

International Search Report for International Application No. PCT/AT2013/050027, International Filing Date Jan. 30, 2013, Search Completed Dec. 6, 2013, Mailed Jan. 2, 2014, 3 pages.

(Continued)

*Primary Examiner* — Ming N Tang
(74) *Attorney, Agent, or Firm* — KPPB LLP

(57) ABSTRACT

A method for monitoring the short-circuiting switching device of a three-phase motor (3) for driving vehicles, which is fed from a DC voltage source (1) via a controlled converter (2), wherein the short-circuiting switching device (5) actuated by a control logic (6) is connected to the inputs of the motor, and the motor currents and/or motor voltages are measured, and a predetermined test pattern, which is different from the voltage/current profiles during operation, is generated with the aid of the controlled converter (2) during a test phase and is supplied to the motor (3), the short-circuiting switching device is actuated for the activation thereof, the current and/or voltage profile is detected during the test phase by opening and closing of short-circuiting contacts and, on the basis of the current and/or voltage distribution in the individual motor phases, the correct open-ing/closing of the short-circuiting contacts is detected and evaluated.

5 Claims, 8 Drawing Sheets

(56) References Cited

FOREIGN PATENT DOCUMENTS

Figure 1:
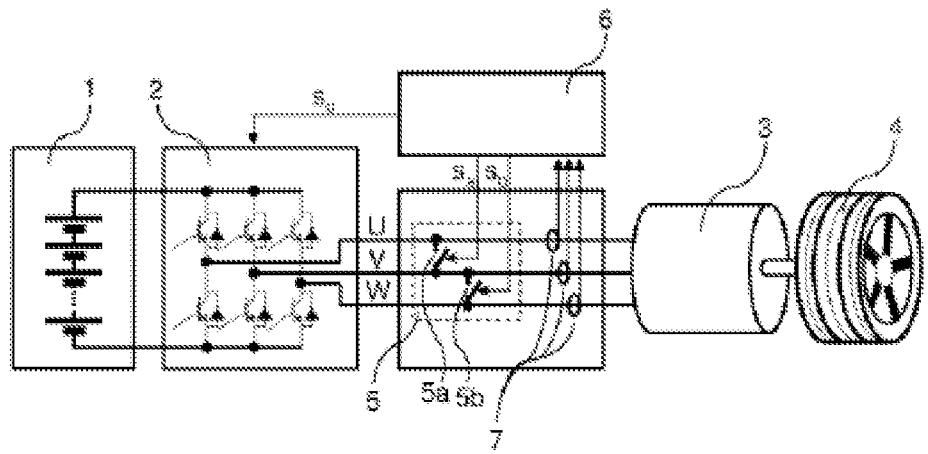

| | | |
|---|---|---|
| EP | 2079159 A2 | 7/2009 |
| JP | 2000253687 A | 9/2000 |

OTHER PUBLICATIONS

International Preliminary Report for Patentability for International Patent Application No. PCT/AT2013/050027, Completed Apr. 2, 2014, 16 pgs.

* cited by examiner

METHOD AND APPARATUS FOR MONITORING THE SHORT-CIRCUITING SWITCHING DEVICE OF A THREE-PHASE MOTOR

The invention relates to a method for monitoring the short-circuiting switching device of a three-phase motor for driving vehicles, which switching device is fed from a DC voltage source via a controlled converter, wherein the short-circuiting switching device actuated by a control logic is connected to the inputs of the motor, and the motor currents and/or motor voltages are measured.

Electric motors of various design, but in particular permanent-magnet-excited synchronous motors, require a "three-phase short circuit" from a certain rotational speed, that is to say they require the low-resistance connection of the three motor phases, in order to be switched off, since an unwanted, strong braking torque would otherwise be produced. Short-circuiting contactors used for this purpose, generally known as short-circuiting switching devices, are thus a safety device that is triggered with the occurrence of a switch-off condition and therefore induces the safe state of the three-phase motor by means of a "three-phase short circuit" (and thus practically torque-free rotation).

The monitoring of the short-circuiting switching device plays an important role in the case of use of the electric motor in a safety-relevant application, since the efficacy of the device which can induce the safe state, specifically the short-circuit contactor, has to be checked at regular intervals. These checks have to be performed at suitable moments in time since they interrupt the normal operation of the electric motor and are to be executable easily and reliably with existing devices—ideally during the switch-on process. The safety aspects are applicable particularly for use in electric and hybrid vehicles.

According to document EP 2 079 159 A2, a drive apparatus is known that has a dynamic brake circuit, wherein a synchronous machine converts braking power via electric resistors and is therefore suitable for performing deceleration procedures.

The object of the invention is to create a method and an associated apparatus which allows the monitoring of the short-circuiting switching device for three-phase motors in such a way that the operation of a driven motor vehicle is not noticeably disturbed and safety is in no way jeopardised.

This object is achieved with a method of the type mentioned in the introduction, in which, in accordance with the invention, a predetermined test pattern, which is different from the voltage/current profiles during operation, is generated with the aid of the controlled converter during a test phase and is supplied to the motor, the short-circuiting switching device is actuated for the activation thereof, the current and/or voltage profile is detected during the test phase by opening and closing short-circuiting contacts and, on the basis of the current and/or voltage distribution in the individual motor phases, the correct opening/closing of the short-circuiting contacts is detected and evaluated.

Thanks to the invention, short-circuiting contactors in vehicles can be checked regularly and using simple means that are provided in any case, without any considerable detriment to the driving behaviour for the user, for example as a result of the creation of unwanted motor torques, and without the need for any operating pauses. The evaluation generally includes a display for the driver and/or a storing and/or interventions in the driving management system of the vehicle.

In accordance with an expedient variant of the invention, test patterns are generated with the aid of the controlled converter during a test phase and are supplied to the motor, wherein only those circuit breakers that are required for the operation of two motor phases are activated, wherein one phase remains de-energised and the amperage through the other two phases during the test pattern is such that the motor practically generates no torque, during the test pattern the currents and/or voltages across the motor phases are measured, and the redistribution of the currents and/or voltages when the short-circuiting contacts are closed and opened is detected and evaluated.

In an advantageous embodiment, test patterns are generated with the aid of the controlled converter during a test phase and are supplied to the motor, wherein switching patterns are applied to each of the motor phases and deviate so slightly from one another that defined, small voltage differences occur between the motor phases and the motor delivers practically no torque, and during the test pattern the currents and/or voltages across the motor phases are measured and the redistribution of the currents and/or voltages when the short-circuiting contacts are closed and opened is detected and evaluated.

Here, it is recommended for this method to be performed during stoppage of the motor.

In accordance with another advantageous variant of the method, the method is performed as the motor rotates, but in a rotational speed range in which there is no passive regenerative braking via diodes bridging the clearances between open contacts of the converter.

In this case it is recommended that, during operation but during operating phases that require no driving/braking torque on the part of the motor, the circuit breakers of the converter are deactivated, the currents occurring with momentary closure of the short-circuiting contacts due to the voltages applied across the motor windings are measured, and the correct opening/closing of the short-circuiting contacts is detected and evaluated on the basis of the occurring current and/or voltages in the individual motor phases.

In a further expedient variant, test patterns can be produced with a rotating, unloaded motor and can be supplied to the motor, and the currents and/or voltages occurring during the momentary closure of the short-circuiting contacts can be measured, and the correct opening/closing of the short-circuiting contacts can be detected and evaluated on the basis of these measurements.

An apparatus for carrying out the method for monitoring the short-circuiting switching device of a three-phase motor for driving vehicles, which is fed from a DC voltage source via a controlled converter, wherein the short-circuiting switching device actuated by a control and monitoring unit is connected to the inputs of the motor and current and/or voltage sensors for measuring the motor currents and/or voltages are provided, which deliver corresponding signals to the control and monitoring unit, which is configured on the one hand to deliver actuation signals to the short-circuiting switching device and on the other hand to deliver control signals to the converter and also to evaluate the correct opening/closing of the short-circuiting contacts on the basis of the current and/or voltage distribution in the individual motor phases, is particularly advantageous.

Figure 2:
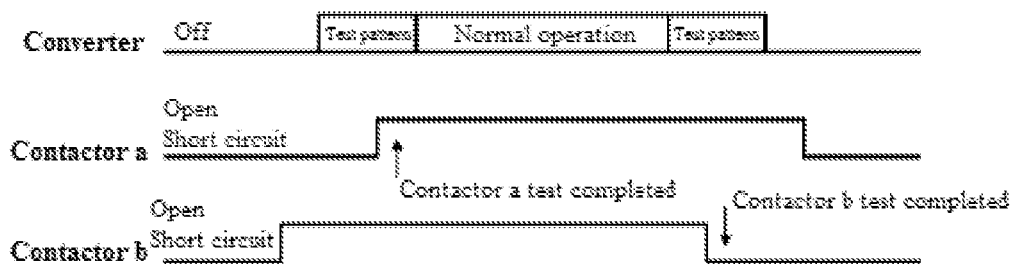
Figure 3:
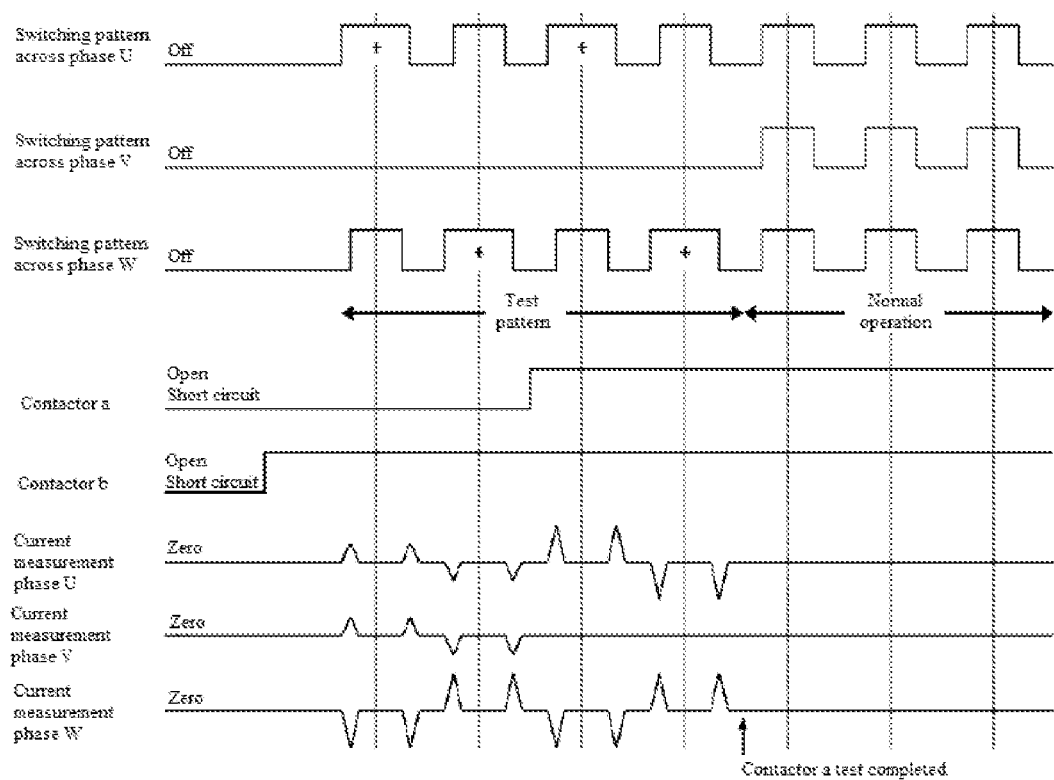
Figure 4:
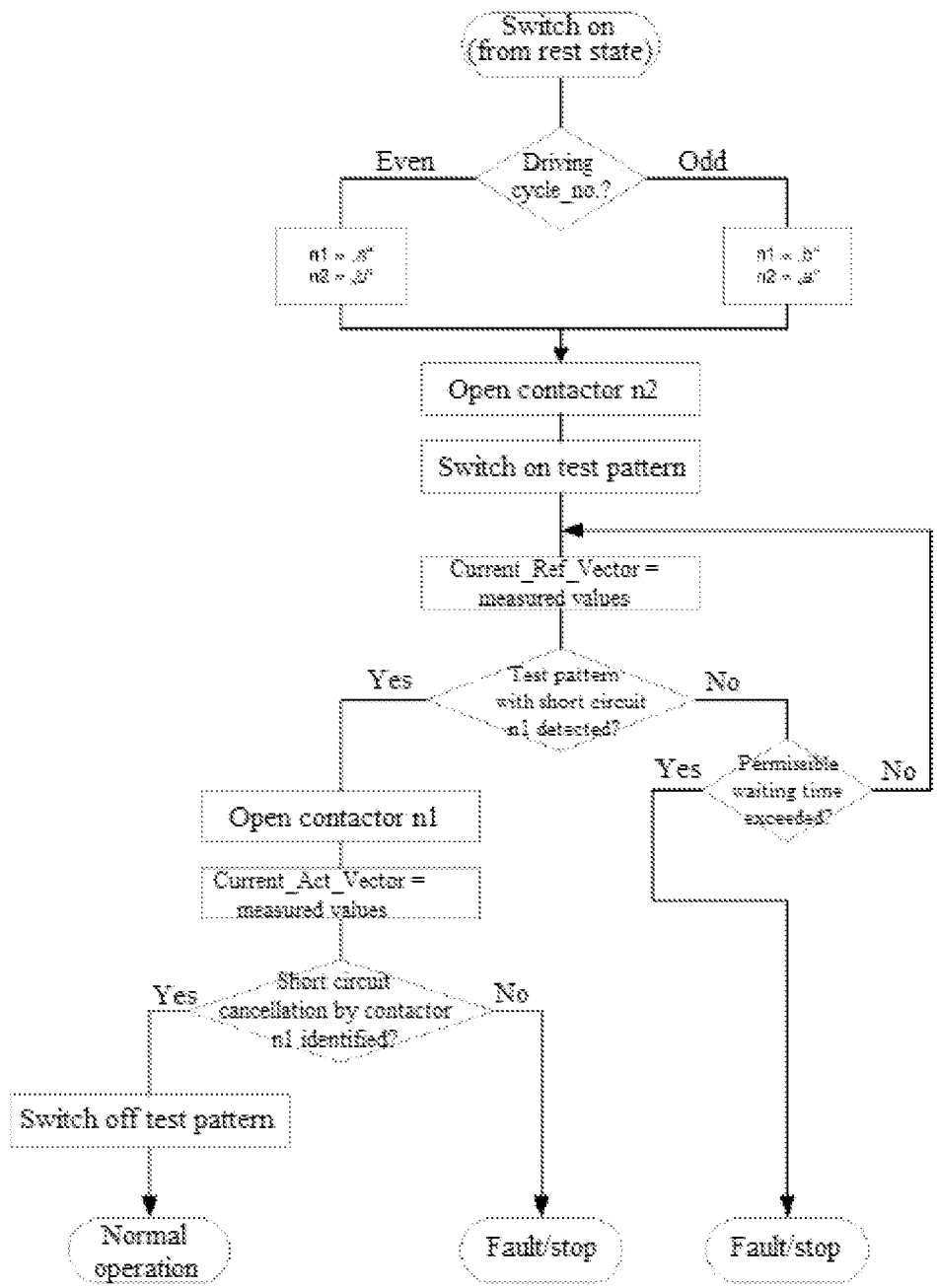
Figure 5:
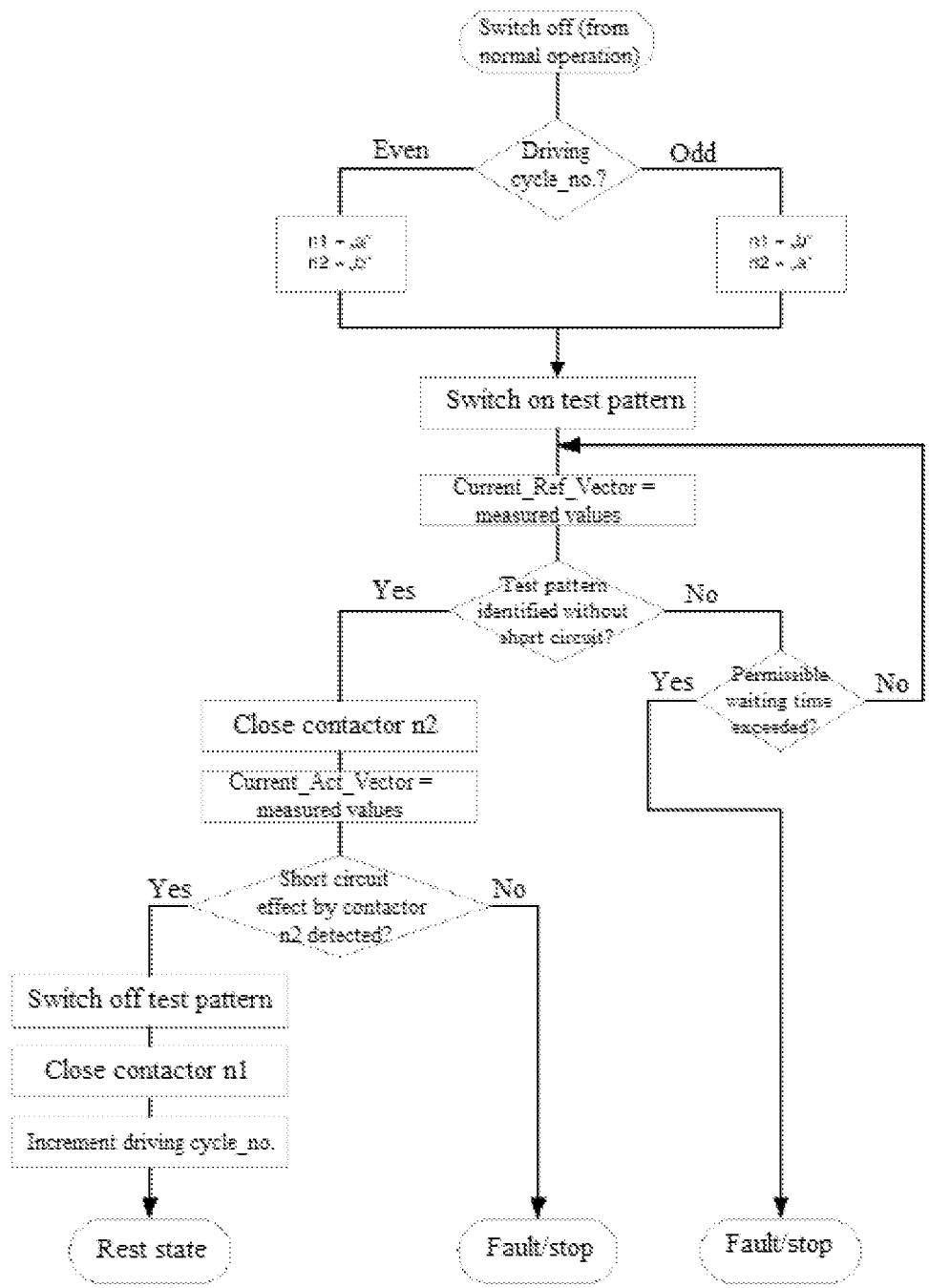
Figure 6:
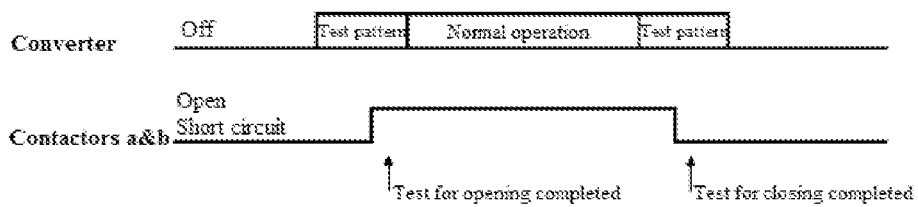
Figure 7:
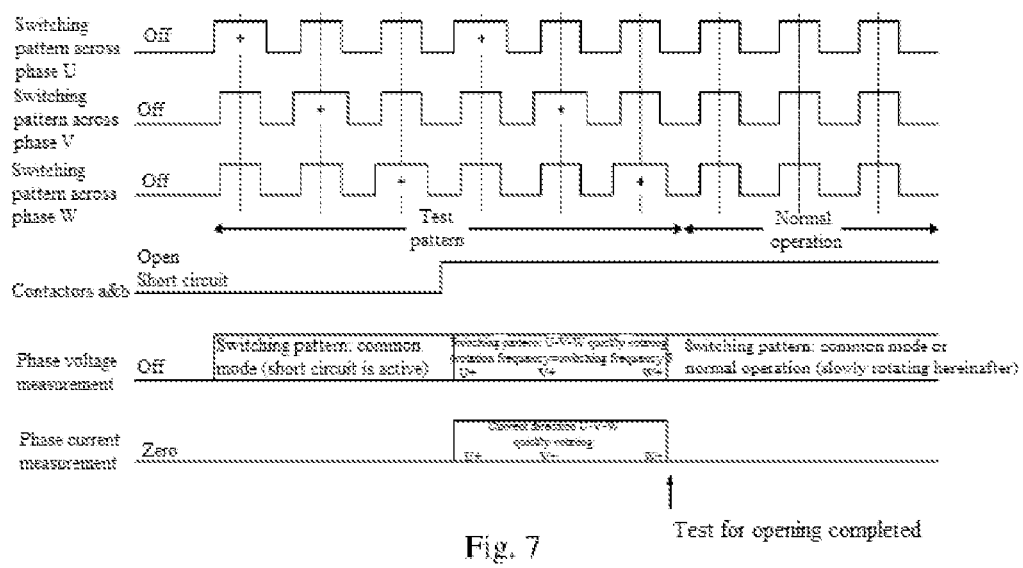
Figure 8:
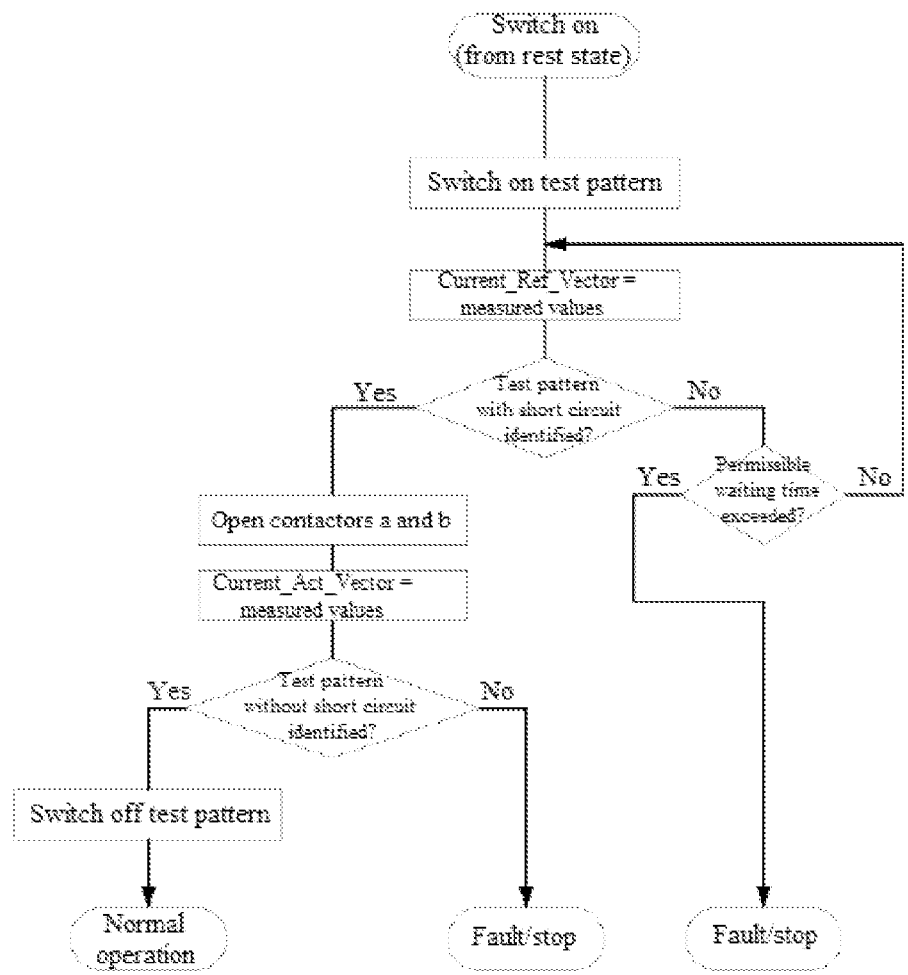
Figure 9:
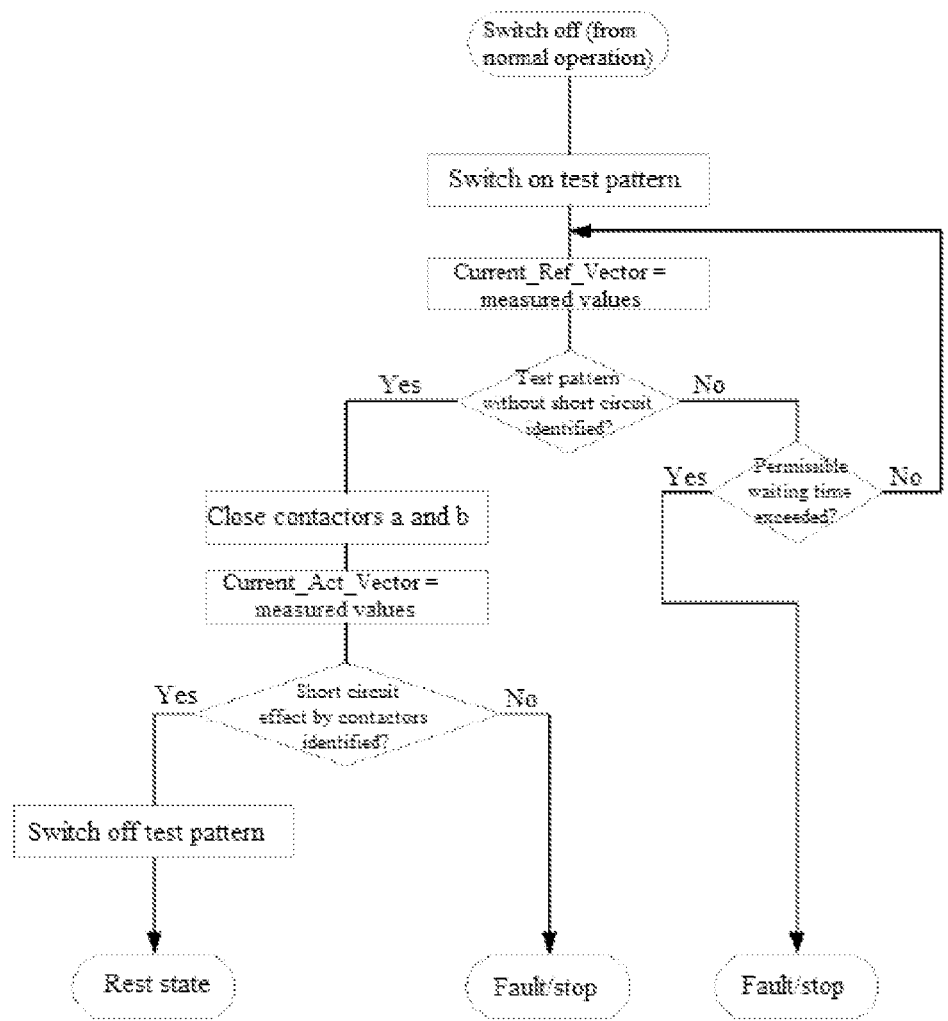
Figure 10:
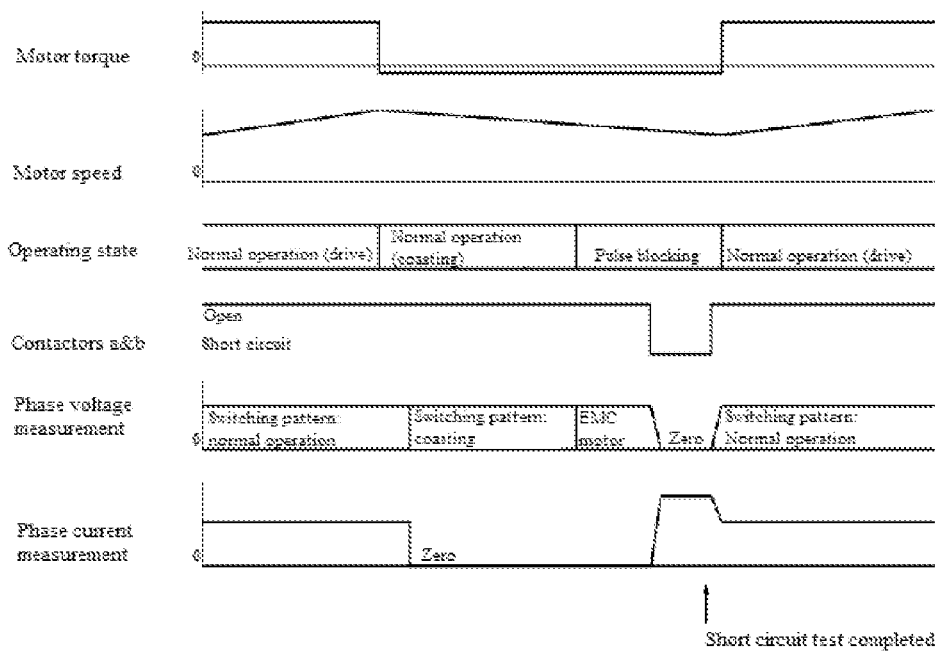

The invention and further advantages are explained in greater detail hereinafter on the basis of exemplary embodiments, which are illustrated in the drawing, in which:

FIG. 1 shows a block diagram of an electric drivetrain in a motor vehicle,

FIG. 2 shows the course over time of a first embodiment of the method according to the invention, FIG. 3 shows the course over time of a first embodiment of the method according to the invention in a detailed illustration of the switch-on situation, FIG. 4 shows a flow diagram concerning the method according to the invention in its first embodiment in a switch-on situation, FIG. 5 shows a further flow diagram concerning the method according to the invention in its first embodiment in a switch-off situation, FIG. 6 shows the course over time of a second embodiment of the method according to the invention, FIG. 7 shows the course over time of a second embodiment of the method according to the invention in a detailed illustration of the switch-on situation, FIG. 8 shows a flow diagram concerning the method according to the invention in its second embodiment in a switch-on situation, FIG. 9 shows a further flow diagram concerning the method according to the invention in its second embodiment in a switch-off situation, and FIG. 10 shows the course over time of a third embodiment of the method according to the invention.

Reference is made first to FIG. 1, which shows a high-voltage battery 1, which is connected via a controlled converter 2 to a three-phase motor, referred to for short as a motor 3. The motor, for example, drives a wheel 4 of the vehicle. It should be clear that the motor 3 is not generally used only as a drive motor, wherein it is fed from the battery 1 via the converter 2, but is also used as a generator in braking operation of the vehicle, wherein it then charges the battery 1 via the converter 2. The vehicle may be a pure electric vehicle or a hybrid vehicle; it can also be a car or a motorbike or also a boat or aircraft. Here, the three-phase motor can drive or brake the drive wheels of the vehicle directly or can also act on the movement of the vehicle via an intermediate assembly.

A short-circuiting switching device 5 is connected to the current feed lines (phases U, V, W) of the motor 3 and has two contactors 5a, 5b and is actuated by a control and monitoring unit 6. Current and/or voltage sensors 7 deliver corresponding signals to the control logic 6, which on the one hand can deliver actuation signals $s_a$, $s_b$ to the two contactors and on the other hand can deliver control signals $s_u$ to the converter 2. Here, the entire control unit is combined in a block, however it is clear that the converter can also contain its own actuation unit, to which a control and monitoring unit of the switching device 5 can then send signals.

Whether all currents and voltages of the three-phase system across the three motor phases of the motor 3 are measured is different from case to case, wherein two current sensors are often sufficient, since in a three-phase system it is possible to use the measurement of the currents in two conductors to ascertain the current in the third conductor.

The contacts of the two contactors 5a, 5b are open when the control current is connected, which allows a normal motor or generator operation. If the control current is omitted, the contacts in each contactor each short circuit two phases of the electric motor. However, electromechanical embodiments other than the arrangement of two contactors are also possible. For example, in the case of a variant of the invention described further below, a single driven contact element could be provided for the short circuit of all three phases of the electric motor.

Since a direct short circuit between two or more motor phases in the normal operation of the motor 3 fed with current via the converter 2 is not permissible and also the windings located in the motor 3 also form a low-resistance connection between the motor phases in addition to an inductance, it is not easily possible to take a measurement in order to identify whether the short-circuiting switching device 5 is open or closed. Within the scope of the invention, a method and variants thereof have therefore been created and will be explained hereinafter.

A method for monitoring the short-circuiting switching device can be carried out as follows with the described apparatus, for which purpose reference is made to FIG. 2. At agreed operating times, for example immediately after switch-on or upon request by the control and monitoring unit 6, a test pattern is generated by the converter 2 actuated by the control and monitoring unit 6 and, of the six circuit breakers located in the converter, which are not described here in greater detail, the test pattern activates only those four that are required for the operation of two phases. The one remaining phase (in FIG. 1 the "middle" phase), which is connected to both contactors 5a, 5b, always remains de-energised with this test pattern. The amperage through the other two phases is to be of such a magnitude during this test pattern that no torque is produced at the motor 3. This can be achieved by way of example by quick current direction reversal (as illustrated in FIG. 3) or by a correspondingly low current flow of constant direction. During this test pattern, the currents and voltages across the three motor phases are measured by the current and/or voltage sensors 7, and corresponding signals are supplied to the control and monitoring unit 6. This detects the redistribution of the currents when a respective contactor 5a or 5b is opened and closed. If both contactors are open, the current distribution [+1; 0; −1] is thus measured. The sum of the three currents must of course always be zero in accordance with Kirchhoff's junction rule. Once one contactor has been closed, the current distribution changes to [(1−x); x; −1]. If the other contactor is closed (and the first is open), this gives [+1; −y; (y−1)]. By comparing the current distributions before and after contactor activation, it is possible to check whether a reliable value range has been achieved for x and y (for example: 0.3<x<0.7). Both contactors are never closed simultaneously during this test pattern, since this would trigger an overcurrent detection in the converter 2. So as not to unnecessarily increase the number of contactor cycles, a switch-on or switch-off sequence can also be introduced, which initially opens just one contactor at the start of each driving cycle, then activates the test pattern and then also opens the second contactor. Following the motor operation, the switch-off sequence is selected such that the ability of both contactors to induce the short circuit is ultimately checked. The order can also be swapped from driving cycle to driving cycle.

The previously described method is also illustrated in the flow diagrams of FIGS. 4 and 5, wherein FIG. 4 describes the logical sequence during the switch-on process and FIG. 5 implements the switch-off process.

A second embodiment of the invention will now be explained with reference to FIGS. 6 to 9, which may be expedient in certain cases, for example with use of a contactor having a single short-circuiting element or when the current sensors are arranged between the converter 2 and short-circuiting switching device 5, that is to say at a location different from that illustrated in FIG. 1. The test pattern, which in this variant has to be generated by the converter, is much more similar to normal operation than in the aforementioned embodiment and uses all six circuit breakers located in the converter 2, but with a high rotational frequency, atypical of operation.

At agreed operating times (for example immediately following switch-on) or upon request by the control and monitoring unit 6, a test pattern is generated by the converter 2, which applies a very similar switching pattern to the three phases, such that only small, yet defined voltage differences occur between the phases. The course over time is illustrated in FIGS. 6 and 7, wherein FIG. 7 includes a further detailed view of the switch-on process and of the used test pattern. The voltage differences between the three phases are attained by small (illustrated in an exaggerated manner in FIG. 7) actuation duration differences during the switching processes of the circuit breakers occurring with high frequency (typically 10 kHz). The amperage should be such during this test pattern that no torque is generated on average at the motor—this is achieved by quick direction changes of the voltage differences (which are small per se). During this test pattern, the currents and voltages across the three motor phases are measured by means of the current and/or voltage sensors 7, wherein the redistribution of the currents is detected by the control and monitoring unit 6 as a contactor or also both contactors 5a, 5b is/are closed and opened. To avoid the unwanted overcurrent detection in the converter, the actuation duration differences between the phases may only be small, which in turn causes only small voltage differences and also rather small current flows through the motor. However, a defined test pattern (for example rotating voltage indicator with defined direction of rotation and defined frequency as illustrated in FIG. 7) can also be measured at low current and voltage amplitudes, and the expected change of the currents and voltages when a contactor or also both contactors is/are closed and opened can be identified. As already mentioned, an individual (three-pole) contactor, which induces the three-phase short circuit, can also be used with this method. The detection can be performed via the current sensors alone, a three-phase voltage measurement alone or also via a combined measurement. The exact position of the current sensors is not crucial for this test method. So as not to increase the number of contactor cycles unnecessarily, a switch-on or switch-off sequence can also be introduced, which initially opens just one contactor at the start of each driving cycle, then activates the test pattern and then also opens the second contactor. Following the motor operation, the switch-off sequence is selected such that the capability of both contactors to induce the short circuit is ultimately checked. The order can also be swapped from driving cycle to driving cycle. If, however, an individual short-circuiting switching device is used, which can induce a three-phase short circuit (and thus contactor 5a and 5b can thus only be activated jointly), this second embodiment of the method according to the invention can thus still be used to test the short-circuiting switching device in accordance with the flow diagram illustrated in FIG. 8 and FIG. 9, wherein FIG. 8 implements the switch-on process and FIG. 9 implements the switch-off process.

Lastly, a third embodiment of the method according to the invention is explained with reference to FIG. 10.

At those operating points at which no driving torque is required from the electric motor (for example "coasting"), the circuit breakers arranged in the converter can all be deactivated at suitable rotational speed ("pulse blocking"). This does not generate any torque or any current flow, but indeed generates the voltage profile typical for the electric motor across the three phases ("EMC motor"), wherein amplitude and frequency of the voltage profile are dependent on rotational speed. By closing the two short-circuiting contactors, the voltage across the motor phases is suddenly reduced, and currents occur across the motor phases that can be effectively measured. In this operating state too, at suitable rotational speed, there is no torque (or there is an acceptable, low braking torque) at the motor shaft. The effect of the short-circuiting switching device can thus also be detected with this embodiment of the method via the change in the currents or the voltages. The last-described variant of the method according to the invention can be used particularly in those systems in which operating points of this type are reached with sufficient frequency, such that the short-circuiting switching device 5 can be tested with sufficient frequency during operation. This third embodiment can also be used in combination with the first two embodiments. In particular, in accordance with a fourth variant, it may be that the switches of the converter 2 cannot be deactivated with a rotating, unloaded motor, but instead test patterns are generated and supplied to the motor. Here, the short-circuiting contacts are temporarily closed and the voltages and/or currents are again measured. The correct opening/closure of the short-circuiting contacts is then detected and output on the basis of the occurring currents and/or voltages in the individual phases of the three-phase lines. This method can be performed in suitable rotational speed ranges, which are usually dependent on the respective motor.

It should not remain unmentioned that the test patterns can be used not only to test the short-circuiting device, but also to determine the "health" of the converter, that is to say to test the correct function thereof. Calibration processes, for example for determining different delay times in the power electronics of the converter, are possible, wherein the control and monitoring unit 6 transmits the measurement results in suitable form to the converter.

It is again emphasized that the described embodiments are only possible examples and that further variants are available within the scope of the patent claims to a person skilled in the art. In particular, more repetitions of the test pattern sequences are possible, as are pulse sequences deviating from those presented.

The invention claimed is:

1. A method for monitoring the short-circuiting switching device of a three-phase motor for driving vehicles, which is fed from a DC voltage source via a controlled converter, wherein the short-circuiting switching device actuated by a control logic is connected to the inputs of the motor, and the motor currents and/or motor voltages are measured,
    characterised in that
    a predetermined test pattern, which is different from the voltage/current profiles during operation, is generated with the aid of the controlled converter during a test phase and is supplied to the motor,
    the short-circuiting switching device is actuated for the activation thereof, the current and/or voltage profile is detected during the test phase by opening and closing short-circuiting contacts and,
    on the basis of the current and/or voltage distribution in the individual motor phases, the correct opening/closing of the short-circuiting contacts is detected and evaluated,
    wherein switching patterns are applied to each of the motor phases and deviate so slightly from one another that defined, small voltage differences occur between the motor phases and the motor delivers practically no torque, and during the test pattern the currents and/or voltages across the motor phases are measured and the redistribution of the currents and/or voltages when the short-circuiting contacts are closed and opened is detected and evaluated.

2. The method according to claim 1, characterised in that said method is performed during stoppage of the motor.

3. The method according to claim 1, characterised in that, during operation but during operating phases that require no driving/braking torque on the part of the motor, the circuit breakers of the converter are deactivated, the currents occurring with momentary closure of the short-circuiting contacts due to the voltages applied across the motor windings are measured, and the correct opening/closing of the short-circuiting contacts is detected and output on the basis of the occurring currents and/or voltages in the individual motor phases.

4. The method according to claim 3, characterised in that test patterns can be produced with a rotating, unloaded motor and can be supplied to the motor, and the currents and/or voltages occurring during the momentary closure of the short-circuiting contacts can be measured, and the correct opening/closing of the short-circuiting contacts can be detected and output on the basis of these measurements.

5. An apparatus for carrying out the method according to claim 1 for monitoring the short-circuiting switching device of a three-phase motor for driving vehicles, which is fed from a DC voltage source via a controlled converter, wherein the short-circuiting device actuated by a control and monitoring unit is connected to the inputs of the motor and current and/or voltage sensors for measuring the motor currents and/or voltages are provided, which deliver corresponding signals to the control and monitoring unit, which is configured on the one hand to deliver actuation signals to the short-circuiting switching device and on the other hand to deliver control signals to the converter and also to detect and to output the correct opening/closing of the short-circuiting contacts on the basis of the current and/or voltage distribution in the individual motor phases, wherein a predetermined test pattern, which is different from the voltage/current profiles during operation, is generated with the aid of the controlled converter during a test phase and is supplied to the motor, wherein switching patterns are applied to each of the motor phases and deviate so slightly from one another that defined, small voltage differences occur between the motor phases and the motor delivers practically no torque, and during the test pattern the currents and/or voltages across the motor phases are measured and the redistribution of the currents and/or voltages when the short-circuiting contacts are closed and opened is detected and evaluated.

\* \* \* \* \*